US009143121B2

(12) United States Patent
Gonzalez et al.

(10) Patent No.: US 9,143,121 B2
(45) Date of Patent: Sep. 22, 2015

(54) SYSTEM AND METHOD OF ADJUSTING A CLOCK SIGNAL

(75) Inventors: Jason Gonzalez, Solana Beach, CA (US); Vannam Dang, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 35 days.

(21) Appl. No.: 13/598,513

(22) Filed: Aug. 29, 2012

(65) Prior Publication Data

US 2014/0062559 A1  Mar. 6, 2014

(51) Int. Cl.
| H03K 3/017 | (2006.01) |
| H03K 7/08 | (2006.01) |
| H03K 5/156 | (2006.01) |

(52) U.S. Cl.
CPC .................................. *H03K 5/1565* (2013.01)

(58) Field of Classification Search
USPC ............... 327/175, 170, 172–174; 326/27, 87
See application file for complete search history.

(56) References Cited

U.S. PATENT DOCUMENTS

| 4,719,369 | A | * | 1/1988 | Asano et al. ..................... 326/30 |
| 5,596,285 | A | * | 1/1997 | Marbot et al. .................. 326/30 |
| 5,604,450 | A | * | 2/1997 | Borkar et al. ................... 326/82 |
| 5,621,335 | A | * | 4/1997 | Andresen ........................ 326/30 |
| 5,677,639 | A | * | 10/1997 | Masiewicz ...................... 326/82 |
| 5,963,071 | A | * | 10/1999 | Dowlatabadi ................. 327/175 |
| 6,744,287 | B2 | * | 6/2004 | Mooney et al. ................ 327/108 |
| 7,009,435 | B2 | * | 3/2006 | Cho et al. ....................... 327/170 |
| 7,386,750 | B2 | * | 6/2008 | Arnold et al. .................. 713/401 |
| 7,423,467 | B1 | * | 9/2008 | Simon ............................ 327/175 |
| 7,760,124 | B2 | | 7/2010 | Trescases |
| 7,802,212 | B2 | | 9/2010 | Best et al. |
| 7,809,052 | B2 | | 10/2010 | Li |
| 8,067,948 | B2 | | 11/2011 | Sequine |
| 8,107,913 | B1 | * | 1/2012 | Nathawad ...................... 455/255 |
| 2002/0075049 | A1 | * | 6/2002 | Yokoyama et al. ........... 327/170 |
| 2003/0112045 | A1 | | 6/2003 | Atallah et al. |
| 2005/0253637 | A1 | | 11/2005 | Mahadevan et al. |
| 2006/0006915 | A1 | * | 1/2006 | Yan et al. ....................... 327/175 |
| 2007/0159224 | A1 | * | 7/2007 | Dwarka et al. ................ 327/175 |
| 2010/0188126 | A1 | | 7/2010 | Cheung et al. |
| 2010/0315119 | A1 | * | 12/2010 | Welker et al. ................... 326/30 |
| 2012/0020173 | A1 | | 1/2012 | Liu |
| 2012/0280732 | A1 | * | 11/2012 | Roytman et al. .............. 327/175 |

OTHER PUBLICATIONS

Tajalli, A.; Mehrmanesh, S.; Atarodi, M., "A duty cycle control circuit for high speed applications," Circuits and Systems, 2004. ISCAS '04. Proceedings of the 2004 International Symposium on, vol. 1, No., pp. I,781-784 vol. 1, May 23-26, 2004.*

(Continued)

*Primary Examiner* — Lincoln Donovan
*Assistant Examiner* — Thomas Skibinski
(74) *Attorney, Agent, or Firm* — Paul S. Holdaway; Kenyon S. Jenckes

(57) ABSTRACT

A method includes receiving an input clock signal at a programmable buffer. The method further includes filtering an output signal from the programmable buffer to generate a filtered signal having a voltage level, where the voltage level indicates a duty cycle of the output signal. The method further includes comparing the voltage level to a reference voltage. The method further includes modifying at least one operating parameter of the programmable buffer to adjust the duty cycle of the output signal.

25 Claims, 8 Drawing Sheets

(56) References Cited

OTHER PUBLICATIONS

Partial International Search Report—PCT/US2013/056050—ISA/EPO—Jan. 28, 2014 (113505WO).

International Search Report and Written Opinion—PCT/US2013/056050—ISA/EPO—May 9, 2014 (113505WO).

* cited by examiner

SYSTEM AND METHOD OF ADJUSTING A CLOCK SIGNAL

I. FIELD

The present disclosure is generally related to adjusting a clock signal.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may include multiple data lane high speed interfaces. Multiple data lane high speed interfaces may require generation and distribution of clock signals with different clock phases. An application may require many different phase variations of a clock signal which may result in multiple voltage controlled oscillators (VCOs) and multiple clock distributions. Further, use of multiple clock distributions may produce clock signals with independent duty cycles that may be distorted. Duty, cycle distortion may cause unwanted skew between clock and data lanes in high speed interfaces, resulting in reduced bandwidth and lower performance in the high speed interfaces.

III. SUMMARY

Systems and methods to adjust a duty cycle and/or a phase of a clock signal are disclosed. A programmable circuit (e.g., a programmable buffer or a programmable delay element) is calibrated to adjust a phase or a duty cycle of a clock signal. During calibration, an input clock signal having a non-balanced duty cycle may be provided to the programmable buffer, and the programmable buffer may generate an output signal. The output signal may be filtered to convert information regarding the non-balanced duty cycle to a direct-current (DC) level. The DC level may be compared to a reference signal having a DC level that corresponds to a desired duty cycle. The programmable buffer may be programmed based on a result of the comparison to tune the output signal to the desired duty cycle.

The input clock signal may be provided to a digital logic gate and to the programmable delay element. The programmable delay element may generate a delayed clock signal based on the input clock signal. The delayed clock signal may also be provided to the digital logic gate. The digital logic gate may create a pulse (e.g., a periodic pulse) representing instances when both the input clock signal and the delayed clock signal have a digital high logic level. The periodic pulse may be filtered to convert information regarding the phase delay between the input clock signal and the delayed clock signal to a DC level. The DC level may be compared to a reference signal having a DC level corresponding to a desired phase delay. In response to the comparison, the programmable delay element may be programmed to tune the phase delay of the delayed clock signal to the desired phase delay.

In a particular embodiment, a method includes receiving an input clock signal at a programmable buffer. The method further includes filtering an output signal from the programmable buffer to generate a filtered signal having a voltage level, where the voltage level indicates a duty cycle of the output signal. The method further includes comparing the voltage level to a reference voltage. The method further includes modifying at least one operating parameter of the programmable buffer to adjust the duty cycle of the output signal.

In another particular embodiment, an apparatus includes a programmable buffer configured to generate an output signal based on a received input clock signal. A duty cycle of the output signal is adjusted based on at least one operating parameter of the programmable buffer.

In another particular embodiment, a method includes receiving an input clock signal and generating a delayed clock signal at a programmable delay element. The method further includes generating an overlap signal based on the input clock signal and the delayed clock signal. The method also includes filtering the overlap signal to generate a filtered signal having a voltage level and generating a control signal by comparing the voltage level to a reference voltage. The method further includes adjusting a delay of the programmable delay element in response to the control signal.

In another particular embodiment, an apparatus includes a programmable delay element configured to generate a delayed clock signal in response to receiving an input clock signal. A delay of the delayed clock signal is adjustable based on a control signal.

One particular advantage provided by at least one of the disclosed embodiments is an ability to adjust a duty cycle of a clock signal to reduce a skew between a clock source and multiple data lanes. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
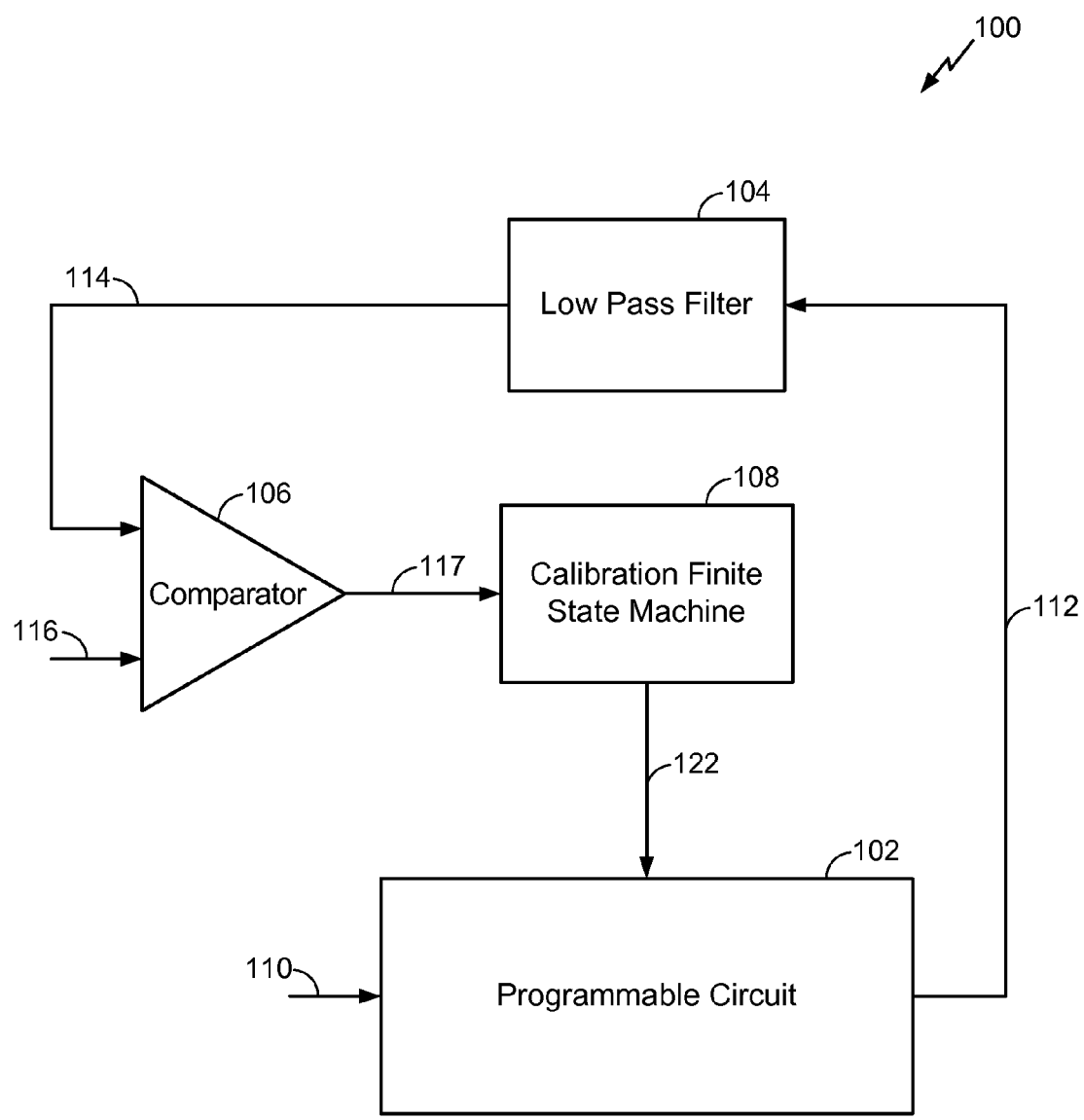
FIG. 1 is a block diagram of a particular illustrative embodiment of a system operable to adjust a duty cycle and/or a phase of a clock signal.

Referring to FIG. 1, a particular illustrative embodiment of a system 100 operable to adjust a duty cycle and/or a phase of a clock signal is shown. The system 100 includes a programmable circuit 102, a low pass filter 104, a comparator 106, and a control circuit 108, such as a calibration finite state machine (FSM). An output of the programmable circuit 102 is coupled to an input of the low pass filter 104 and an output of the low pass filter 104 is coupled to a first input of the comparator 106. An output 117 of the comparator 106 is coupled to an input of the control circuit 108 and an output 122 of the control circuit 108 is coupled to an input of the programmable circuit 102.

The programmable circuit 102 is configured to receive an input clock signal 110. The input clock signal 110 may have a non-balanced duty cycle (e.g., a duty cycle that is not equal to fifty percent). In a particular embodiment, the programmable circuit 102 may include a programmable buffer configured to generate an output signal based on the received input clock signal 110, such as described with respect to FIGS. 2 and 3. A duty cycle of the output signal may be adjusted based on at least one operating parameter of the programmable buffer. The output signal may be an output clock signal. In an alternate embodiment, the programmable circuit 102 may include a programmable delay element configured to generate a delayed clock signal in response to receiving the input clock signal 102, such as described with respect to FIG. 4. A delay (e.g. a phase) of the delayed clock signal may be adjustable based on the output 122 of the control circuit 108.

The low pass filter 104 is configured to receive an output signal 112 of the programmable circuit 102. The low pass filter 104 is further configured to generate a filtered signal 114 by filtering the output signal 112 of the programmable circuit 102. The filtered signal 114 is provided to the first input of the comparator 106.

The comparator 106 is configured to receive the filtered signal 114 at the first input and to receive a reference signal 116 at a second input. The comparator 106 is configured to compare a voltage level of the filtered signal 114 to a voltage level of the reference signal 116 and to generate a comparison signal 117 based on the comparison. For example, the voltage level of the reference signal 116 may correspond to a fraction of a supply voltage, where the supply voltage represents a one-hundred percent duty cycle (i.e., a full duty cycle) and the voltage level of the reference signal 112 represents a corresponding fraction of the frill duty cycle. The voltage level of the filtered signal 114 may correspond to a direct-current (DC) voltage level and the voltage level of the reference signal 116 may correspond to a reference DC voltage level. The comparison signal 117 may correspond to information regarding a difference between the voltage level of the filtered signal and the voltage level of the reference signal 116. The comparison signal 117 is provided to the input of the control circuit 108.

The control circuit 108 is configured to receive the comparison signal 117. The control circuit 108 is configured to generate a control signal 122 based on information received from the comparison signal 117. The control signal 122 is provided to the programmable circuit 102. In particular embodiment, the control circuit 108 may modify at least one operating parameter of a programmable buffer within the programmable circuit 102 to adjust the duty cycle of the output signal 112. For example, the control circuit 108 may selectively enable one or more pull-up or pull-down transistors to adjust a charging rate or discharging rate of the output signal 112 as described in further detail with respect to FIG. 2. In an alternate embodiment, the control circuit 108 may adjust a delay of a programmable delay element within the programmable circuit 102. In some embodiments, the control circuit 108 may be implemented as a finite state machine configured to select a set of digital codes based on a most recently selected digital code and based on a value of the comparison signal 117 and to provide the selected set of digital codes to a programmable buffer or a programmable delay element, such as described with respect to FIGS. 2-4. The selected set of digital codes may modify operating parameters of the programmable buffer and the programmable delay element. In other embodiments, the control circuit 108 may be implemented as a processor executing instructions to select a set of digital codes based on a most recently selected digital code and based on a value of the comparison signal 117.

During operation of a first particular embodiment, the system 100 adjusts a duty cycle of an output signal. The programmable circuit 102 receives the input clock signal 110 having a non-balanced duty cycle. The programmable circuit 102 generates the output signal 112 in response to receiving the input clock signal 110 and provides the output signal 112 to the low pass filter 104. The low pass filter 104 filters the output signal 112 (e.g., by removing high-frequency components and charging a capacitor to a voltage representing a time-averaged voltage of low-frequency components) and generates the filtered signal 114 having a voltage level that corresponds to the non-balanced duty cycle. The low pass filter 104 provides the filtered signal 111 to the first input of the comparator 106. The reference signal 116 having a voltage level is provided to the second input of the comparator 106. The voltage level of the reference signal 116 may be indicative of a desired duty cycle. For example, the voltage level of the reference signal 116 may be indicative of a fifty percent duty cycle (i.e., a balanced duty cycle). The voltage level of the reference signal 116 may correspond to a fraction of a supply voltage, where the supply voltage represents a one-hundred percent duty cycle (i.e., a full duty cycle) and the voltage level of the reference signal 112 represents a corresponding fraction of the full duty cycle.

The comparator 106 compares the voltage level of the filtered, signal 114 to the voltage level of the reference signal 116 and generates the comparison signal 117 based on the comparison. The control circuit 108 receives the comparison signal 117 and modifies at least one operating parameter of a programmable buffer within the programmable circuit 102 based on the comparison signal 117. Modifying the operating parameters of the programmable buffer may adjust the non-balanced duty cycle of the output signal 112 to approach the desired duty cycle. For example, modifying the operating parameters of the programmable buffer may adjust (i.e., increase or decrease) the non-balanced duty cycle of the output signal 112 to approach a fifty percent duty cycle. For example, the control circuit 122 may adjust a charging rate or discharging rate of the output signal 112 by modifying a digital code configured to selectively enable one or more pull-up transistors or pull-down transistors. An illustrative method of adjusting a duty cycle of the output signal 112 is further described with reference to FIG. 5.

During operation of a second particular embodiment, the system 100 generates a phase-shifted version of the input clock signal 110. With respect to the second particular embodiment, the output signal 112 of the programmable circuit 102 may correspond to an overlap signal 112. For example, the programmable circuit 102 receives the input clock signal 110 having a first phase. A programmable delay element (not shown) within the programmable circuit 102 generates a delayed clock signal (not shown) in response to receiving the input clock signal 110. The overlap signal 112 may be generated based on the input clock signal 110 and the delayed clock signal. For example, the overlap signal 112 may include a periodic pulse that corresponds to an instance when both the input clock signal 110 and the delayed clock signal have a same digital value (e.g., a high value or a low value). The overlap signal 112 is provided to the low pass filter 104. The low pass filter 104 filters the overlap signal 112 to generate the filtered signal 114 having a voltage that represents a time-averaged voltage of low-frequency components of the overlap signal 112. Because a pulse width of the overlap signal 112 corresponds to an amount of overlap between the input clock signal 110 and the delayed data signal, a duty cycle of the overlap signal 112 corresponds to a phase difference between the input clock signal 110 an the delayed clock signal. The low pass filter 104 generates the filtered signal 114 having a voltage level that corresponds to a duty cycle of the overlap signal 112 (and therefore corresponding to a phase of the delayed clock signal as compared to the input clock signal 110). The low pass filter 104 provides the filtered signal 114 to the first input of the comparator 106. The reference signal 116 is provided to the second input of the comparator 106. The voltage level of the reference signal 116 may be indicative of a desired phase shift (e.g., a 30° phase shift, a 60° phase shift, a 90° phase shift, etc.).

The comparator 106 compares the voltage level of the filtered signal 114 to the voltage level of the reference signal 116 and generates the comparison signal 117 based on the comparison. The control circuit 108 receives the comparison signal 117 and generates the control signal 122 based on the received comparison signal 117. The control signal 122 may correspond to a digital code that is provided to the programmable delay element within the programmable circuit 102 to adjust a delay of the programmable delay element (e.g., adjusting the phase of the delayed clock signal). For example, each value of the digital code may correspond to a different delay time of the programmable delay element. An illustrative method of adjusting a phase of the delayed clock signal is further described with reference to FIG. 6.

After adjusting the digital code, a resulting duty cycle of the output signal 112 may be filtered and compared to the reference signal 116 in a process that repeats until the duty cycle of the output signal 112 substantially equals or approximates the desired duty cycle. By repeatedly comparing the filtered signal 114 and the reference signal 116 and adjusting the duty cycle of the output signal in response to the comparison, the system 100 of FIG. 1 may thus adjust a duty cycle of the output signal 112 to approach a desired duty cycle (e.g., a fifty percent duty cycle) to improve bandwidth and throughput in high speed interfaces while reducing power consumption that may rest t from using differential clocks to adjust a duty cycle. The system 100 of FIG. 1 may adjust a phase of a delayed clock signal using a single delay element that is programmable by digital codes which may improve flexibility as compared to systems that use a fixed number of non-programmable delay elements to adjust a phase.

Figure 2:
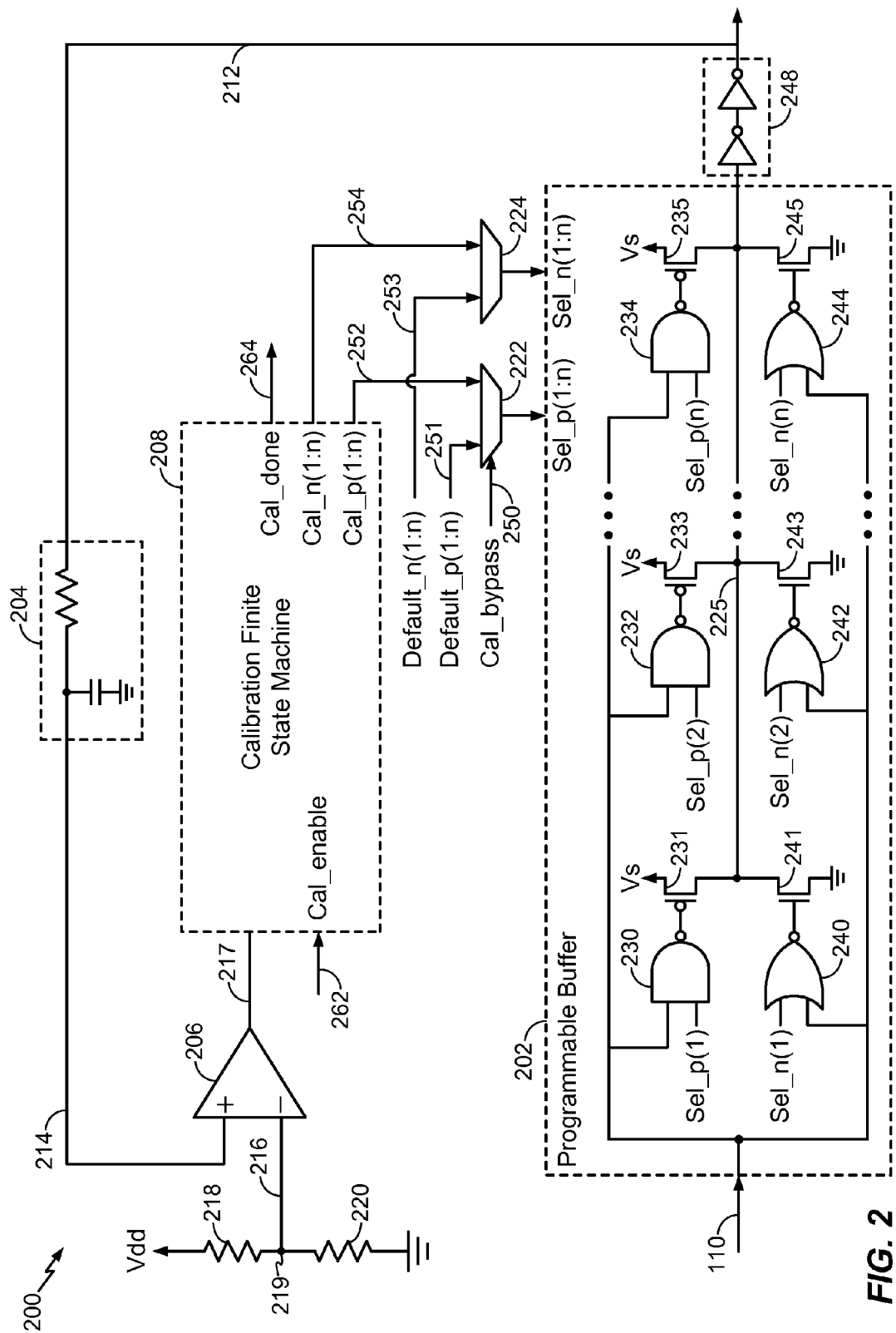
FIG. 2 is a diagram of a particular illustrative embodiment of a circuit operable to adjust a duty cycle of a clock signal.

Referring to FIG. 2, a diagram of a particular illustrative embodiment of a circuit 200 operable to adjust a duty cycle of a clock signal is shown. The circuit includes a programmable buffer 202, a low pass filter 204, a comparator 206, and a calibration FSM 208. The programmable buffer 202 may correspond to the programmable circuit 102 of FIG. 1. The low pass filter 204 may correspond to the low pass filter 104 of FIG. 1, the comparator 206 may correspond to the comparator 106 of FIG. 1, and the calibration FSM 208 may correspond to the control circuit 108 of FIG. 1.

The programmable buffer 202 may include a first set of digital logic configured as a pull-up circuit to charge a node 225 that generates a logic level (i.e., a voltage) of an output signal 212. The first set of digital logic includes a first NAND digital logic gate 230, a second NAND digital logic gate 232, and an Nth NAND digital logic gate 234. The first set of digital logic further includes a first p-type metal oxide semiconductor (PMOS) transistor 231, a second PMOS transistor 233, . . . , and an Nth PMOS transistor 235, where N may be any integer value greater than two. For example, in an implementation where N=5, the first set of digital logic may include five NAND digital logic gates coupled to five PMOS transistors. The programmable buffer 202 may also include a second set of digital logic configured as a pull-down circuit to discharge the node 225 that generates the logic level of the output signal 212. The second set of digital logic includes a first NOR digital logic gate 240, a second NOR digital logic gate 242, and an Nth NOR digital logic gate 244. The second set of digital logic further includes a first n-type metal oxide semiconductor (NMOS) transistor 241, a second NMOS transistor 243, . . . , and an Nth NMOS transistor 245.

The programmable buffer 202 is configured to receive the input clock signal 110. The programmable buffer 202 is configured to provide the input clock signal 110 to a first input of the first NAND digital logic gate 230, a first input of the second NAND digital logic gate 232, and a first input of the Nth NAND digital logic gate 234. The first NAND digital logic gate 230 is configured to selectively activate the first PMOS transistor 231 based on a logic level of the input clock signal 110 and based on a digital code Sel_p(1) provided to a second input of the first NAND digital logic gate 230 from the calibration FSM 208. For example, the first NAND digital logic gate 230 may activate the first PMOS transistor 231 when the input clock signal 110 has a logic high level and the digital code Sel_p(1) corresponds to a logic high level. The first PMOS transistor 231 is configured to selectively charge a node 225 based on an output of the first NAND digital logic gate 230. For example, the first PMOS transistor 231 may function as a pull-up transistor that charges the node 225 based on a buffer supply voltage (Vs) upon activation.

The second NAND digital logic gate 232 is configured to selectively activate the second PMOS transistor 233 based on the logic level of the input clock signal 110 and based on a digital code Sel_p(2) provided to a second input of the second NAND digital logic gate 232 from the calibration FSM 208. For example, the second NAND digital logic gate 232 may activate the second. PMOS transistor 233 when the input clock signal 110 has a logic high level and the digital code Sel_p(2) corresponds to a logic high level. The second PMOS transistor 233 is configured to selectively charge the node 225 based on an output of the second NAND digital logic gate 232. For example, the second PMOS transistor 233 may function as a pull-up transistor that charges the node 225 based on the buffer supply voltage (Vs) upon activation.

The Nth NAND digital logic gate 234 is configured to selectively activate the Nth PMOS transistor 235 based on the digital logic level of the input clock signal 110 and based on a digital code Sel_p(n) provided to a second input of the Nth NAND digital logic gate 234 from the calibration FSM 208. For example, the Nth NAND digital logic gate 234 may activate the Nth PMOS transistor 235 when the input clock signal 110 has a logic high level and the digital code Sel_p(n) corresponds to a logic high level. The Nth PMOS transistor 235 is configured to selectively charge the node 225 based on an output of the Nth NAND digital logic gate 234. For example, the Nth PMOS transistor 235 may function as a pull-up transistor that charges the node 225 based on the buffer supply voltage (Vs) upon activation.

The programmable buffer 202 is further configured to provide the input clock signal 110 to a first input of the first NOR digital logic gate 240, a first input of the second NOR digital logic gate 242, and a first input of the Nth NOR digital logic gate 244. The first NOR digital logic gate 240 is configured to selectively activate the first NMOS transistor 241 based on the digital logic level of the input clock signal 110 and based on a digital code Sel_n(1) provided to a second input of the first NOR digital logic gate 240 from the calibration FSM 208. For example, the first NOR digital logic gate 240 may activate the first NMOS transistor 241 when the input clock signal 110 has a logic low level and the digital code Sel_n(1) corresponds to a logic low level. The first NMOS transistor 241 is configured to selectively discharge the node 225 based on an output of the first NOR digital logic gate 240. For example, the first NMOS transistor 241 may function as a pull-down transistor that discharges the node 225 to ground upon activation.

The second NOR digital logic gate 242 is configured to selectively activate the second NMOS transistor 243 based on the digital logic level of the input clock signal 110 and based on a digital code Sel_n(2) provided to a second input of the second NOR digital logic gate 242 from the calibration FSM 208. For example, the second NOR logic gate 242 may activate the second NMOS transistor 243 when the input clock signal 110 has a logic low level and the digital code Sel_(2) corresponds to a logic low level. The second NMOS transistor 243 is configured to selectively discharge the node 225 based on an output of the second NOR digital logic gate 242. For example, the second NMOS transistor 243 may function as a pull-down transistor that discharges the node 225 to ground upon activation.

The Nth NOR digital logic gate 244 is configured to selectively activate the Nth NMOS transistor 245 based on the digital logic level of the input clock signal 110 and based on a digital code Sel_n(n) provided to a second input of the Nth NOR digital logic gate 244 from the calibration FSM 208. For example, the Nth NOR digital logic gate 244 may activate the Nth NMOS transistor 245 when the input clock signal 110 has a logic low level and the digital code Sel_n(n) corresponds to a logic low level. The Nth NMOS transistor 245 is configured to selectively discharge the node 225 based on an output of the Nth NOR digital logic gate 244. For example, the Nth NMOS transistor 245 may function as a pull-down transistor that discharges the node 225 to ground upon activation.

In the particular illustrative embodiment of FIG. 2, a pair of inverters 248 is configured to buffer a voltage of the node 225 and generate the output signal 212 based on the buffered voltage. The low pass filter 204 is configured to receive the output signal 212. The low pass filter 204 may include a resistor and a capacitor operable to filter the output signal 212 (e.g., by shorting high-frequency components of the output signal 212 and reducing a voltage across a series resistor as a result of a decreasing impedance of a capacitance in parallel with a load) to generate a DC level corresponding to the output signal 212. For example, the low pass filter 204 may generate a filtered signal 214 by filtering the output signal 212. The filtered signal 214 is provided to a first input of the comparator 206.

The comparator 206 is configured to receive the filtered signal 214 at the first input and to receive a reference signal 216 at a second input. The comparator 206 is configured to compare a voltage level of the filtered signal 214 to a voltage level of the reference signal 216 and to generate a comparison signal 217 based on the comparison. The voltage level of the reference signal 216 may be indicative of a desired duty cycle. For example, when the voltage level of the reference signal 216 equal to ½ VDD, the desired duty cycle may correspond to fifty percent. The comparison signal 217 is provided to an input of the calibration FSM 208.

The calibration FSM 208 is configured to receive the comparison signal 217 and adjust the duty cycle of the output signal 212 in response to receiving a calibration enable signal (Cal_enable) 262. For example, the calibration FSM 208 is configured to monitor whether the duty cycle of the output signal 212 is too high or too low (as compared to the reference signal 216) based on the comparison signal 217. The calibration FSM 208 is further configured to provide a first set of calibration digital codes (Cal_p(1:n) 252 to a first multiplexer 222 and to provide a second set of calibration digital codes (Cal_n(1:n)) 254 to a second set of multiplexer 224.

During operation, the input clock signal 110 is provided to the first input of the first NAND digital logic gate 230, to the first input of the second NAND digital logic gate 232, and to the first input of the Nth NAND digital logic gate 234. The input clock signal 110 may have a duty cycle that is not fifty percent (i.e., the input clock signal 110 may not have a logic high level and a logic low level for an equal amount of time in each clock cycle). The first multiplexer 222 provides the digital code Sel_p(1) to the second input of the first NAND digital logic gate 230, provides the digital code Sel_p(2) to the second input of the second NAND digital logic gate 232, and provides the digital code Sel_p(n) to the second input of the Nth NAND digital logic gate 234. The digital codes provided by the first multiplexer 222 (i.e., Sel_p(1), Sel_p(2), and Sel_p(n)) may be pre-determined default values or values responsive to an output of the calibration FSM 208 (as described below). The digital codes provided by the first multiplexer 222 may control the rate at which the node 225 charges (i.e., the charging rate) by selectively activating and deactivating certain ones of the PMOS transistors 230, 232, 234 via the NAND digital logic gates 231, 233, 235.

The programmable buffer 202 selectively charges the node 225 based on a digital voltage level of the input clock signal 110 and based on at least one operating parameter (i.e., the digital codes provided by the first multiplexer 222 (i.e., Sel_p (1), Sel_p(2), and Sel_p(n))). For example, when the input clock signal 110 is at a logic high level and the digital code Sel_p(1) corresponds to a logic high level, the first NAND logic gate 230 activates the first PMOS transistor 231. Upon activation, the first PMOS transistor 231 functions as a pull-up transistor and charges the node 225 based on the buffer supply voltage (Vs). When the input clock signal 110 is at a logic high level and the digital code Sel_p(2) corresponds to a logic high level, the second NAND logic gate 232 activates the second PMOS transistor 233. Upon activation, the second PMOS transistor 233 functions as a pull-up transistor and charges the node 225 based on the buffer supply voltage (Vs). When the input clock signal 110 is at a logic high level and the digital code Sel_p(n) corresponds to a logic high level, the Nth NAND logic gate 234 activates the Nth PMOS transistor 235. Upon activation, the Nth PMOS transistor 235 functions as a pull-up transistor and charges the node 225 based on the buffer supply voltage (Vs). The node 225 charges at a faster rate when multiple PMOS transistors are activated as compared to when only one PMOS transistor is activated. For example, the node 225 may charge at a faster rate when the first and second PMOS transistors 231, 233 are activated as compared to when only the first PMOS transistor 231 is activated. Further, the node 225 may charge at a faster rate when the first, second, and Nth PMOS transistors 231, 233, 235 are activated as compared to when only the first and second PMOS transistors 231, 233 are activated.

The input clock signal 110 is also provided to the first input of the first NOR digital logic gate 240, to the first input of the second NOR digital logic gate 242, and to the first input of the Nth NOR digital logic gate 244. The second multiplexer 224 provides the digital code Sel_n(1) to the second input of the first NOR digital logic gate 240, provides the digital code Sel_n(2) to the second input of the second NOR digital logic gate 242, and provides the digital code Sel_n(n) to the second input of the Nth NOR digital logic gate 244. The digital codes provided by the second multiplexer 224 (i.e., Sel_n(1), Sel_n(2), and Sel_n(n)) may be pre-determined default values (e.g., corresponding to all logic low levels, all logic high levels, or another combination of logic levels) or values responsive to an output of the calibration FSM 208 (as described below). The digital codes provided by the second multiplexer 224 may control the rate at which the node 225 discharges (i.e., the discharging rate) by selectively activating and deactivating the NMOS transistors 241, 243, 245 via the NOR digital logic gates 240, 242, 244.

A low to high signal transition of the output signal 212 may be delayed relative to the input clock signal 110 by reducing the number of active PMOS transistors 231, 233, 235. A high to low signal transition of the output signal 212 may be delayed relative to the input clock signal 110 by reducing the number of active NMOS transistors 241, 243, 245. The duty cycle of the output signal 212 may be adjusted by adjusting a delay of the low to high signal transition, adjusting a delay of the high to low signal transition, or any combination thereof. The first set of digital logic (i.e., the pull-up circuit) and the second set of digital logic (i.e., the pull-down circuit) may be independently adjustable.

The output signal 212 is provided to the low pass filter 204. The low pass filter 204 filters the output signal 212 (e.g., shorts high-frequency components of the output signal 212 and reduces a voltage across a series resistor as a result of a decreasing impedance of a capacitance in parallel with a load) and generates a filtered signal 214 having a voltage level that indicates the duty cycle of the output signal 212. The voltage level of the filtered signal 214 may correspond to a DC voltage level. The filtered signal 214 is provided to the first input of the comparator 206, and the reference signal 216 having a voltage level is provided to the second input of the comparator 206. The voltage level of the reference signal 216 may correspond to a DC voltage level and may be indicative of a desired duty cycle (i.e., a balanced/fifty percent duty cycle)

The voltage level of the reference signal 216 may be equal to or approximately equal to a half of a supply voltage (Vdd/2). For example, a first resistor 218 and a second resistor 220 may be connected in series and may have equal resistances to form a voltage divider. The reference signal 216 is generated at a node 219 that connects the first and second resistors 218, 220. The node 219 that connects the first and second resistors 218, 220 may have a voltage level equal to or approximately equal to half the sum of the supply voltage (Vdd) and ground (i.e., Vdd/2). A voltage level of Vdd/2 may indicate a duty cycle of fifty percent (e.g., the desired duty cycle).

The comparator 206 compares the voltage level of the filtered signal 214 to the voltage level (e.g., Vdd/2) of the reference signal 216 and provides a result of the comparison to the control circuit 108 via the comparison signal 217.

The calibration FSM 208 modifies operating parameters of the programmable buffer 202 based on the result of the comparison. For example, the calibration FSM may monitor the results of the comparison by periodically checking the comparison signal 217 (e.g., checking the comparison signal 217 approximately once every microsecond) in response to a value of the enable signal 262. In response to checking the comparison signal 217, the calibration FSM 208 may determine whether the duty cycle of the output signal 212 is too high or too low compared to the desired duty cycle (i.e. a fifty percent duty cycle) indicated by the reference signal 216. When the duty cycle of the output signal 212 is too low, the calibration FSM 208 may selectively deactivate at least one NMOS transistor 240, 242, 244 (i.e., delaying a high to low transition), activate at least one PMOS transistor 230, 232, 234 (i.e., accelerating a low to high transition), or any combination thereof, by providing digital codes to the first and second multiplexers 222, 224. When the duty cycle of the output signal 212 is too high, the calibration FSM 208 may selectively activate at least one previously inactive NMOS transistor 240, 242, 244, deactivate at least one previously active PMOS transistor 230, 232, 234, or any combination thereof, by providing digital codes to the first and second multiplexers 222, 224.

For example, the calibration FSM 208 may provide the first set of calibration digital codes (Cal_p(1:n)) 252 to the first multiplexer 222 to selectively activate the NMOS transistors 240, 242, 244 and selectively deactivate the PMOS transistors 230, 232, 234. A first set of default codes (Default_p(1:n)) 251 may also be provided to the first multiplexer 222. The first multiplexer 222 selects whether to provide the first set of calibration digital codes (Cal_p(1:n)) 252 or the first set of default codes (Default_p(1:n)) 251 based on a bypass signal (Cal_bypass) 250. When the first multiplexer 222 selects the first set of calibration digital codes 252, the programmable buffer 202 may selectively activate or deactivate at least one PMOS transistor 230, 232, 234 based on the first set of calibration digital codes 252 to adjust the rate at which the node 225 charges.

As another example, the calibration FSM 208 may provide the second set of calibration digital codes (Cal_n(1:n)) 254 to the second multiplexer 224. A second set of default codes (Default_n(1:n)) 253 may also be provided to the second multiplexer 224. The second multiplexer 224 selects whether to provide the second set of calibration digital codes (Cal_n(1:n)) 254 or the second set of default codes (Default_n(1:n)) 253. When the second multiplexer 224 selects the second set of calibration digital codes 254, the programmable buffer 202 may selectively activate or deactivate at least one NMOS transistor 240, 242, 244 based on the second set of calibration digital codes 254 to adjust the rate at which the node 225 discharges. Thus, the operating parameters (e.g., activation or deactivation of pull-up or pull-down transistors) of the programmable buffer 202 may be modified to adjust the duty cycle of the output signal 212 to a desired duty cycle.

The circuit 200 of FIG. 2 may thus adjust a duty cycle of the output signal 212 to be substantially equal to fifty percent (or another desired duty cycle) using digital codes. The digital codes may be provided to multiple data paths for multi-lane applications. For example, the circuit 200 of FIG. 2 may calibrate a duty cycle of the output signal 212 as a clock signal for one data lane by providing a set of digital codes to the programmable buffer 202 and may distribute an identical set of digital codes to other programmable buffers duty cycle correction buffers) associated with other data lanes to adjust the duty cycle of the clock signals propagating through the other data lanes.

Figure 3:
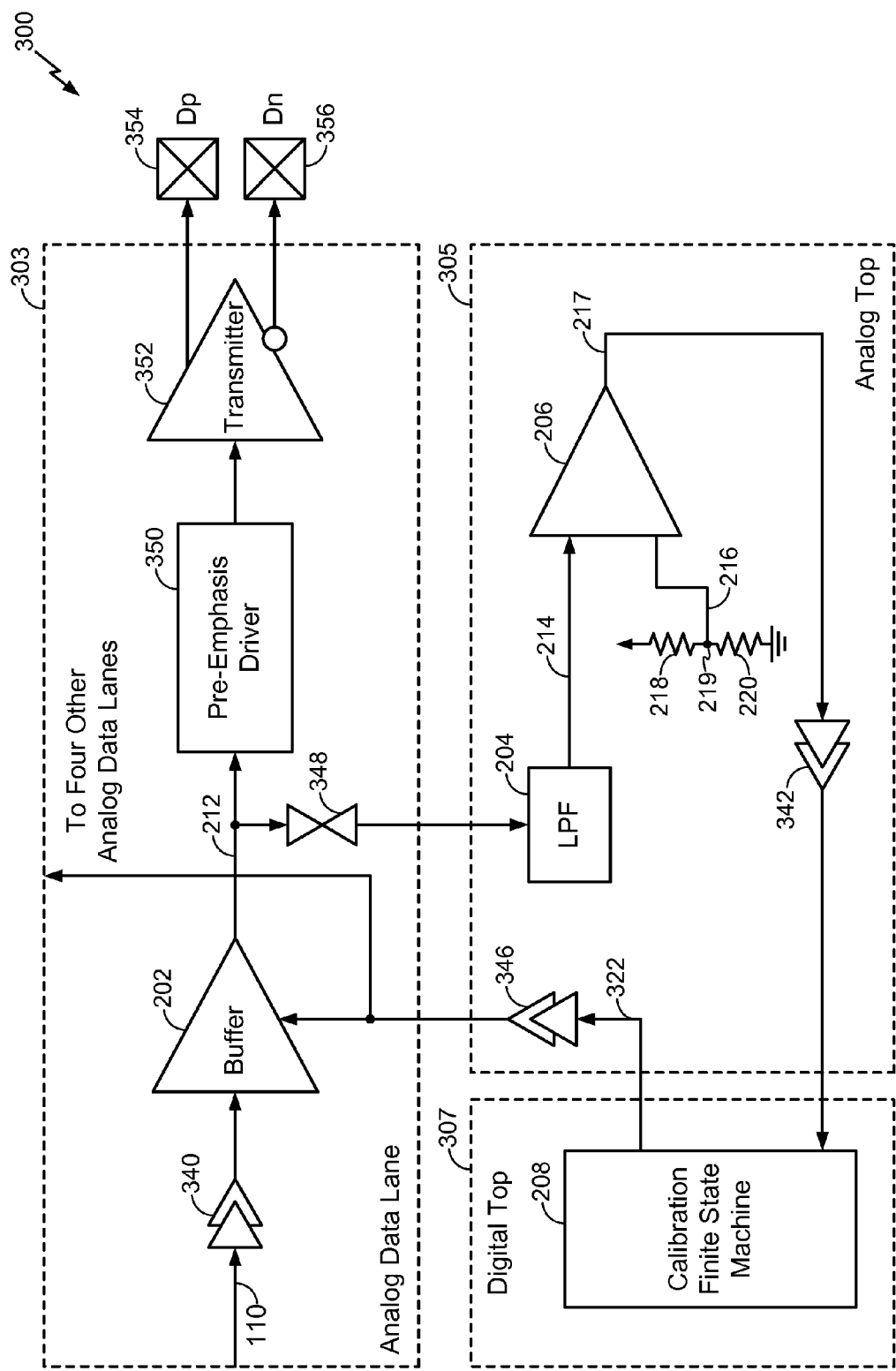
FIG. 3 is a block diagram of a particular illustrative embodiment of a system operable to adjust a duty cycle of a clock signal at a transmitter.

Referring to FIG. 3, a block diagram of a particular illustrative embodiment of a system 300 operable to adjust a duty cycle of a clock signal at a transmitter is shown. The system 300 includes the programmable buffer 202, the low pass filter 204, the comparator 206, and the calibration FSM 208 that operates in a similar manner as described with respect to the circuit 200 of FIG. 2. The programmable buffer 202, a pre-emphasis driver 350, and a high-speed transmitter are in an analog data lane 303. The low pass filter 204 and the comparator 206 are in a top level analog domain 305. The calibration FSM 208 is in a top level digital domain 307. Each of the analog data lane 303, the top level analog domain 305, and the top level digital domain 307 may correspond to a different voltage domain. A first level shifter 340, a second level shifter 342, and a third level shifter 346 enable signaling between the analog data lane 303, the top level analog domain 305, and the top level digital domain 307.

The programmable buffer 20, the pre-emphasis driver 350, and the high-speed transmitter 352 are included, in the first analog data lane 303. One or more other analog data lanes (e.g., four other analog data lanes, not shown) may include similar devices. Feedback (e.g., digital codes) from the calibration FSM 208 is provided to programmable buffers included in each of the analog data lanes (e.g., the first analog data lane 303 and the four other analog data lanes) so that each programmable buffer (e.g., the programmable buffer 202 and programmable buffers associated with the four other data lanes) may adjust a corresponding duty cycle of an output signal based on duty cycle feedback of the first analog data lane 303, as described with respect to FIG. 2.

The first level shifter 340 is configured to receive the input clock signal 110 and shift a voltage level of the input clock signal 110 from a digital domain to a corresponding voltage level in an analog domain. For example, the first level shifter 340 may shift the input clock signal 110 having a voltage in the digital domain to a signal having a voltage in the analog domain. The shift may include up-converting the voltage level of the input clock signal 110 based on a 0.9 digital volts per 1.8 analog volts ratio. The first level shifter 340 is further configured to provide the input clock signal 110 to the programmable buffer 202.

The second level shifter 342 is configured to receive the comparison signal 217 and shift a voltage level of the comparison signal 217 from the analog domain to a corresponding voltage level in the digital domain. For example, the second level shifter 342 may shift the comparison signal 217 having a voltage in the analog domain to a signal having a voltage in the digital domain. The shift may include down-converting the voltage level of the comparison signal 217 based on a 1.8 analog volts per 0.9 digital volts ratio. The second level shifter 342 is further configured to provide the comparison signal 217 to the calibration FSM 208.

The third level shifter 346 is configured to receive a control signal 322 corresponding to digital codes utilized to modify the operating parameters of the programmable buffer 202. The third level shifter 346 is further configured to shift a voltage level of the control signal 322 from the digital domain to a corresponding voltage level in the analog domain. The third level shifter may provide the control signal 322 to the programmable buffer 202 of the first data lane and to programmable buffers for the other four analog data lanes (not shown).

During operation, the programmable buffer 202 receives the input clock signal 110 and generates the output signal 212. The output signal 212 is provided to the pass gate 348 prior to being provided to the low pass filter 204. The low pass filter 204 filters the output signal 212 to generate the filtered signal 214 having a voltage level indicative of the duty cycle of the output signal 212, as described in FIG. 2. The filtered signal 214 is provided to the first input of the comparator 206 and reference signal 216 is provided to the second input of the comparator 206, as described in FIG. 2. The comparison signal 217 of the comparator 206 (i.e., the result of the comparison between the voltage level of the filtered signal 214 and the voltage level of the reference signal 216) is provided to the level shifter 342 prior to being provided to the calibration FSM 208. An output 322 of the calibration FSM 208 is provided to the programmable buffer 202 via the third level shifter 346 to modify operating parameters. The output 322 of the calibration FSM 208 may correspond to the first set of calibration digital codes (Cal_p(1:n)) 252 and the second set of calibration digital codes (Cal_n(1:n)) 254, as described with respect to FIG. 2. The programmable buffer 202 may correspond to the first analog data lane 303 and modifying the operating parameters of the programmable buffer 202 may result in adjusting the duty cycle of the output signal 212 of the first analog data lane 303 to be fifty percent. Adjusting the duty cycle of the output signal 212 to fifty percent may require multiple cycles of adjusting the digital codes of the calibration FSM 208 to attain a duty cycle approximately equal to fifty percent according to a resolution of the programmable buffer 202 (e.g., a programmable buffer with more selectable transistors may have higher resolution and enable higher accuracy than a programmable buffer with fewer selectable transistors). The output 322 of the calibration FSM 208 is also provided to four other programmable buffers (not shown) to adjust duty cycles of output signals (not shown) of the four other analog data lanes (not shown) to fifty percent.

The output signal 212 is farther provided to the pre-emphasis driver 350. The pre-emphasis driver 350 may boost transition edges in the output signal 212. The output of the pre-emphasis driver 350 is provided to the high-speed transmitter 352. The output of the high-speed transmitter 352 is provided to the first pad 354 and the second pad 356 as a differential signal to be transmitted across a communication channel (not shown).

The system 300 of FIG. 3 may thus adjust a duty cycle of the output signal 212 to be substantially equal to fifty percent using digital codes which may improve expansion efficiency for multi-lane applications as compared to duplicating hardware components configured to adjust a duty cycle for every data lane in a multi-lane application. For example, the system 300 of FIG. 3 may adjust the duty cycle of the output signal 212 of the first analog data lane 303 by providing a set of digital codes to the programmable buffer 202 and distribute an identical set of digital codes to programmable buffers of the four other analog data lanes.

Figure 4:
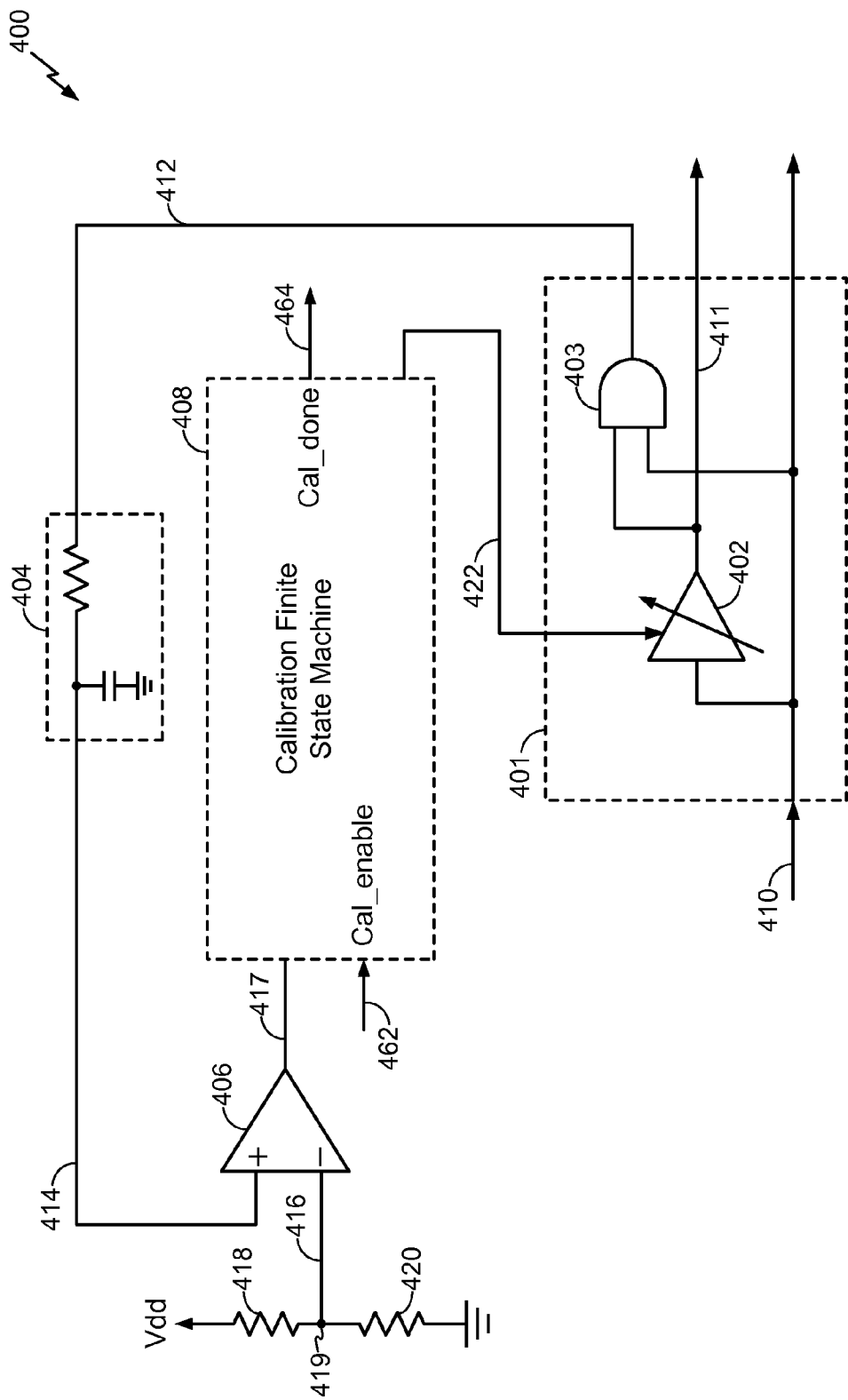
FIG. 4 is a diagram of a particular illustrative embodiment of a circuit operable to adjust a phase of a clock signal.

Referring to FIG. 4, a diagram of a particular illustrative embodiment of a circuit 400 operable to adjust a phase of a clock signal is shown. The circuit 400 includes a clock phase generator 401, a low pass filter 404, a comparator 406, and a calibration finite state machine (FSM) 408. The low pass filter 404 may correspond to the low pass filter 104 of FIG. 1, the comparator 406 may correspond to the comparator 106 of FIG. 1, and the calibration FSM 408 may correspond to the control circuit 108 of FIG. 1.

The clock phase generator 401 includes a programmable delay element 402 and an AND digital logic gate 403. The clock phase generator 401 may be within the programmable circuit 102 of FIG. 1. The programmable delay element 402 is configured to receive an input clock signal 410 and a control signal 422. The programmable delay element 402 is further configured to generate a delayed clock signal 411 and to provide the delayed clock signal 411 to a second input of the AND digital logic gate. A delay of the programmable delay element 402 (i.e., a phase of the delayed clock signal 411) may be adjustable based on the control signal 422. The AND digital logic gate 402 is configured to receive the input clock signal 410 at a first input and to receive the delayed clock signal 411 at the second input. The AND digital logic gate 403 is further configured to generate an overlap signal 412 based on the input clock signal 410 and the delayed clock signal 411.

The low pass filter 404 is configured to receive the overlap signal 412. The low pass filter 404 may include a resistor and a capacitor operable to filter the overlap signal 412. For example, the low pass filter 404 may to generate a filtered signal 414 having a voltage level via filtering the overlap signal 412 (e.g., by shorting high-frequency components of the overlap signal 412 and reducing a voltage across a series resistor as a result of a decreasing impedance of a capacitance in parallel with a load). The voltage level of the filtered signal 414 may be indicative of the phase of the delayed clock signal 411. The filtered signal 414 is provided to a first input of the comparator 406.

The comparator 406 is configured to receive the filtered signal 414 at the first input and to receive a reference signal 416 at a second input. The comparator 406 is configured to compare the voltage level of the filtered signal 414 to a voltage level of the reference signal 416 and to generate a comparison signal 417 based on the comparison. The comparison signal 417 may correspond to a phase of the delayed clock signal 411. The comparison signal 417 is provided to the input of the calibration FSM 408.

The calibration FSM 408 may include digital circuitry configured to receive the comparison signal 417 and to adjust the delay of the programmable delay element 402 in response to receiving a calibration enable signal (Cal_enable) 462. For example the calibration FSM 408 is configured to monitor whether the phase of the delayed clock signal 411 based on a most recently selected set of calibration digital codes is too large or too small as compared to the input clock signal 410. The calibration FSM 408 is configured to monitor the phase of the delayed clock signal 411 via the comparison signal 417 to provide an updated set of calibration digital codes to the programmable delay element 402. The set of calibration digital codes may adjust the delay of the programmable delay element 402.

During operation, the input clock signal 410 having a first phase is provided to an input of the programmable delay element 402 and to the first input of the AND logic gate 403. The programmable delay element 402 generates the delayed clock signal 411 having a second phase and provides the delayed clock signal 411 to the second input of the AND digital logic gate 403.

The AND digital logic gate 403 generates the overlap signal 412 based on the first phase of the input clock signal 410 and the second phase of the delayed clock signal 411. For example, during a period when both the input clock signal 410 and the delayed clock signal 411 are at logic high levels, the AND digital logic gate 403 generates the overlap signal 412 having a logic high level. During periods when either (or both) of the input clock signal 410 or the delayed clock signal 411 is at a logic low level, the overlap signal 412 has a logic low level. Thus, the overlap signal 412 may correspond to a pulse (i.e., a periodic pulse) having a width representing a time period when both the input clock signal 410 and the delayed clock signal 411 have a digital high logic level. The overlap signal 412 is provided to the low pass filter 404. The low pass filter 404 filters the overlap signal 412 to generate the filtered signal 414. The voltage level of the filtered signal 414 indicates the second phase of the delayed clock signal 411 (i.e., the voltage level corresponds to a duty cycle of the overlap signal 412 and the duty cycle of the overlap signal 412 corresponds to the phase delay of the delayed clock signal 411 as compared to the input clock signal 410). The filtered signal 414 is provided to the first input of the comparator 406 and the reference signal 416 is provided to the second input of the comparator 406.

The voltage level of the reference signal 416 represents the desired phase delay of the delayed clock signal 411. For example, if the desired phase delay of the delayed clock signal 411 is 90 degrees, the voltage level of the reference signal 416 will be at $90/360$ VDD or $\frac{1}{4}$ VDD. If the desired phase delay of the delayed clock signal 411 is sixty degrees, the voltage level of the reference signal 416 will be $60/360$ VDD or $\frac{1}{6}$ VDD. The voltage level of the reference signal 416 may change in response to resistance values of a first resistor 418 and a second resistor 420. For example, if the first resistor 418 has a resistance that is three times greater than a resistance of the second resistor 420, node 419 (and the voltage level of the reference signal 416) will have a DC voltage level of $\frac{1}{4}$ VDD. Alternatively, if the first resistor 418 and the second resistor 420 have equal resistance values, node 419 will have a voltage level of $\frac{1}{2}$ VDD.

The comparator 406 compares the voltage level of the filtered signal 414 to the voltage level of the reference signal 416 and provides a result of the comparison to the calibration FSM 408. The calibration FSM 408 generates digital codes and provides a control signal 422 (corresponding to the digital codes) to the programmable delay element 402 to adjust the delay of the programmable delay element 402. The digital codes may adjust operating parameters of the programmable delay element 402 to adjust the second phase of the delayed clock signal 411. To illustrate, the programmable delay element 402 may include the programmable buffer 202 of FIG. 2 and the codes may be used to selectively delay transitions of the input clock signal 410. As another example, the programmable delay element 402 may include multiple delay elements such as a chain of serially-coupled inverters and each digital code may select an output of a corresponding inverter in the chain. For example, adjusting the delay of the programmable delay element 402 may result in adjusting the second phase of the delayed clock signal 411 (i.e., the phase of the delayed clock signal 411 relative to the input clock signal 410) to the desired phase.

The circuit 400 of FIG. 4 may thus adjust a phase of the delayed clock signal 411 while reducing the number of delay elements needed for multiple clock phases. For example, the circuit 400 of FIG. 4 may adjust the phase of the delayed clock signal 411 using digital codes provided to the programmable delay element 402, avoiding an increased area and power usage associated with conventional systems that use multiple delay elements or multiple clock distributions.

Figure 5:
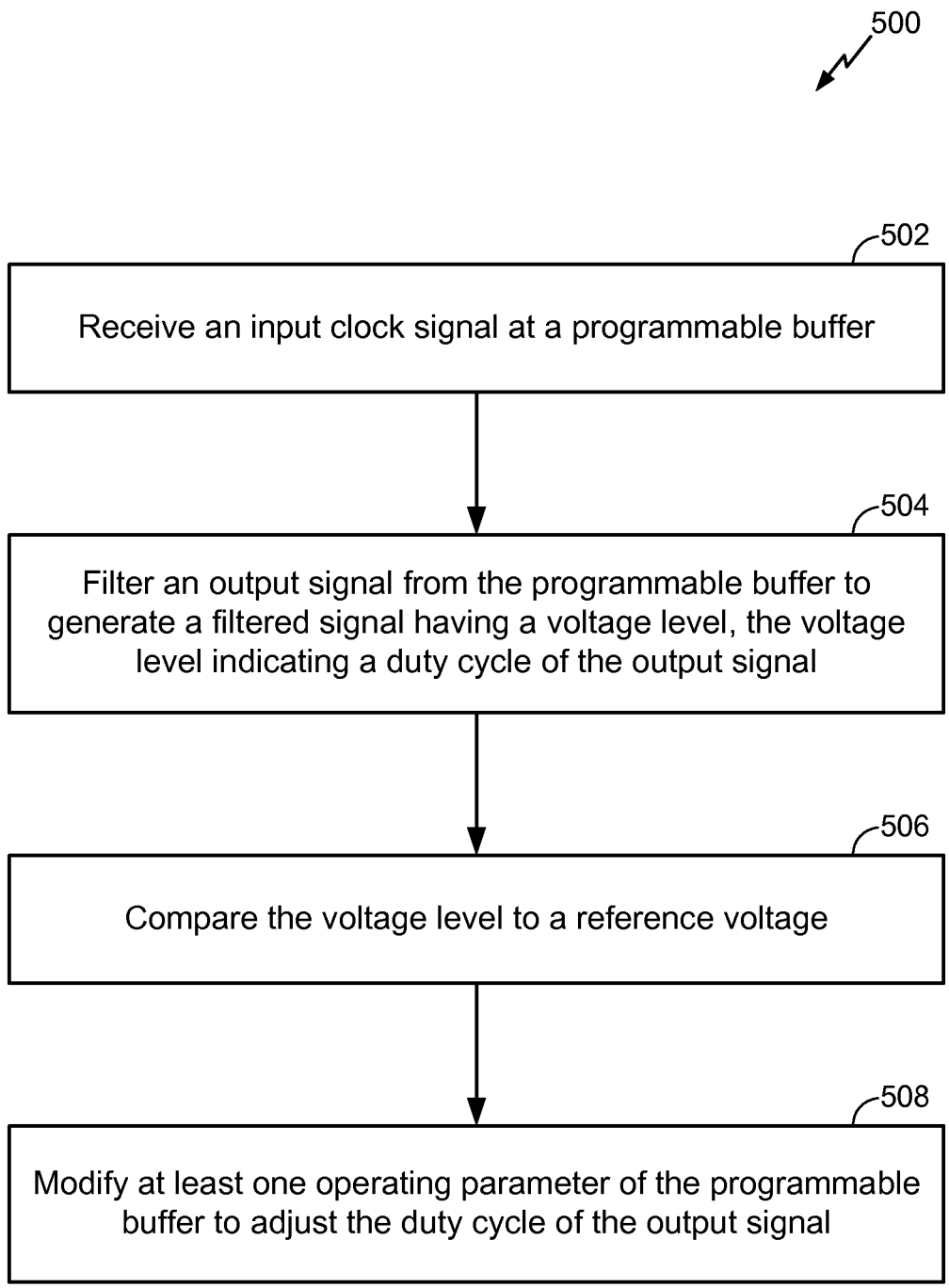
FIG. 5 is a flowchart of a particular embodiment of a method of adjusting a duty cycle of a clock signal.

Referring to FIG. 5, a flowchart of a particular embodiment of a method 500 of adjusting a duly cycle of a clock signal is shown. In an illustrative embodiment, the method 500 may be performed using the system 100 of FIG. 1, the circuit 200 of FIG. 2, or the system 300 of FIG. 3.

The method 500 includes receiving an input clock signal at a programmable buffer, at 502. For example, in FIG. 1, the programmable circuit 102 may receive the input clock signal 110. As another example, in FIG. 2, the programmable buffer 202 may receive the input clock signal 110.

An output signal from the programmable buffer may be filtered to generate a filtered signal having a voltage level, at 504. For example, in FIG. 2, the low pass filter 204 may filter the output signal 212 from the programmable buffer 202 to generate the filtered signal 214 having the voltage level. The voltage level may indicate a duty cycle of the output signal. For example, in FIG. 2, the voltage level of the filtered signal 214 may indicate the duty cycle of the output signal 212. The voltage level may be compared to a reference voltage, at 506. For example, in FIG. 2, the comparator 206 may compare the voltage level of the filtered signal 214 to the voltage level of the reference signal 216 (i.e., the reference voltage).

At least one operating parameter of the programmable buffer may be modified to adjust the duty cycle of the output signal, at 508. For example, in FIG. 2, the calibration FSM 208 may modify operating parameters of the programmable buffer 202 to adjust the duty cycle of the output signal 212. The calibration FSM 208 may provide the first set of calibration digital codes (Cal_p(1:n)) 252 to the first multiplexer 222 to selectively activate individuals ones of the PMOS transistors 230, 232, 234. A first set of default codes (Default_p(1:n)) 251 may also be provided to the first multiplexer 222. The first multiplexer 222 selects whether to provide the first set of calibration digital codes (Cal_p(1:n) 252 or the first set of default codes (Default_p(1:n)) 251 based on the bypass signal (Cal_bypass) 250. When the first multiplexer 222 selects the first set of calibration digital codes 252 (i.e., (Sel_p(1:n)) that corresponds to (Cal_p(1:n))), the programmable buffer 202 may selectively activate or deactivate at least one PMOS transistor 230, 232, 234 based on the first set of calibration digital codes 252 to adjust the rate at which the node 225 charges. The calibration FSM 208 may also provide the second set of calibration digital codes (Cal_n(1:n)) 254 to the second multiplexer 224. A second set of default codes (Default_n(1:n)) 253 may also be provided to the second multiplexer 224. The second multiplexer 224 selects whether to provide the second set of calibration digital codes (Cal_n(1:n)) 254 or the second set of default codes (Default_n(1:n)) 253. When the second multiplexer 224 selects the second set of calibration digital codes 254 (i.e., (Sel_n(1:n)) that corresponds to (Cal_n(1:n)), the programmable buffer 202 may selectively activate or deactivate at least one NMOS transistor 240, 242, 244 based on the second set of calibration digital codes 254 to adjust the rate at which the node 225 discharges. As another example, a processor may be programmed to select set of digital codes to modify operating parameters of the programmable buffer 202 to adjust the duty cycle of the output signal 212. The processor may select the set of digital codes in response receiving a signal (e.g., the comparison signal 217) corresponding to a comparison between the duty cycle of the output 212 and a desired duty cycle. Thus, the operating parameters of the programmable buffer 202 may be modified to adjust the duty cycle of the output signal 212.

The method 500 may adjust the duty cycle of the output signal 212 to be substantially equal to fifty percent using digital codes which may be used for multi-lane applications. One data lane may be calibrated by providing a set of digital codes to the programmable buffer 202 and an identical set of digital codes may be distributed to other data lanes with duty cycle correction buffers for multi-lane applications.

It will be appreciated that the method 500 of FIG. 5 may adjust a duty cycle of the output signal 212 to be substantially equal to fifty percent (or another desired duty cycle) using digital codes to adjust the duty cycle of the output signal 212 until the duty cycle of the output signal 212 is approximately the desired duty cycle. The digital codes may be provided to multiple data paths for multi-lane applications. For example, the method 500 of FIG. 5 may be used to calibrate a duty cycle of the output signal 212 to be used as a clock signal for one data lane by providing a set of digital codes to the programmable buffer 202 and may distribute an identical set of digital codes to other programmable buffers (e.g., duty cycle correction buffers) associated with other data lanes to adjust the duty cycle of the clock signals propagating through the other data lanes.

Figure 6:
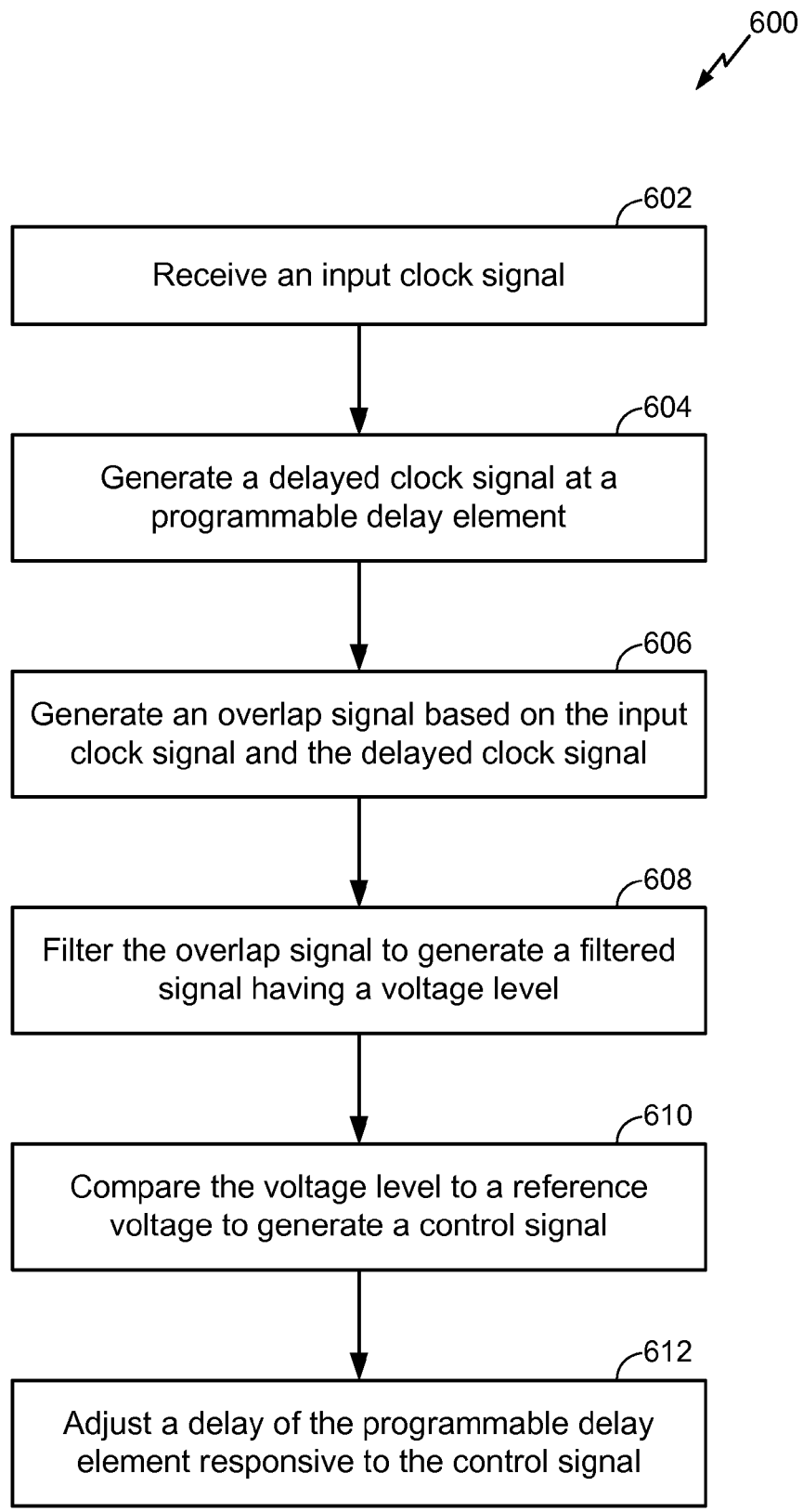
FIG. 6 is a flowchart of a particular embodiment of a method of adjusting a phase of a clock signal.

Referring to FIG. 6, a flowchart of a particular embodiment of a method 600 of adjusting a phase of a clock signal is shown. In an illustrative embodiment, the method. 600 may be performed by the system 100 of FIG. 1 or the circuit 400 of FIG. 4.

The method 600 includes receiving an input clock signal, at 602. For example, in FIG. 1, the programmable circuit 102 may receive the input clock signal 110. As another example, in FIG. 4, the programmable delay element 402 may receive the input clock signal 410.

A delayed clock signal may be generated at a programmable delay element, at 604. For example, in FIG. 4, the programmable delay element 402 may generate the delayed clock signal 411. An overlap signal may be generated based on the input clock signal and the delayed clock signal, at 606. For example, in FIG. 4, the AND digital logic gate 403 may generate the overlap signal 412 based on the input clock signal 410 and the delayed clock signal 411. During a period when both the input clock signal 410 and the delayed clock signal 411 are at logic high levels, the overlap signal 412 may have a logic high level. During periods when either or both of the input clock signal 410 or the delayed clock signal 411 is at a logic low level, the overlap signal 412 may have a logic low level.

The overlap signal may be filtered to generate a filtered signal having a voltage level, at 608. For example, in FIG. 4, the low pass filter 404 may filter the overlap signal 412 to generate the filtered signal 414 having the voltage level. The voltage level may indicate the phase of the delayed clock signal 411 as compared to the input clock signal 410. The voltage level may be compared to a reference voltage to generate a control signal, at 610. For example, the comparator 406 may compare the voltage level of the filtered signal 414 to the reference voltage of the reference signal 416. The comparator 406 may further provide the result of the comparison to the calibration FSM 408 to generate the control signal 422.

A delay of the programmable delay element may be adjusted responsive to the control signal. For example, in FIG. 1, the calibration FSM 408 provides the control signal 422 to the programmable delay element 402 to adjust the delay of the programmable delay element 402. The control signal 422 may correspond to digital codes that configure the programmable delay element 402 to adjust the second phase (i.e., the delay) of the delayed clock signal 411. For example, adjusting the delay of the programmable delay element 402 may result in adjusting the second phase of the delayed clock signal 411 (i.e., the phase of the delayed clock signal relative to the input clock signal 410) to the desired phase.

The method 600 may adjust a phase of the delayed clock signal 411 while reducing the number of delay elements needed for multiple clock phases. For example, the phase of the delayed clock signal 411 may be adjusted using digital codes provided to the programmable delay element 402 rather than utilizing multiple delay elements or multiple clock distributions that may increase area and power usage.

Figure 7:
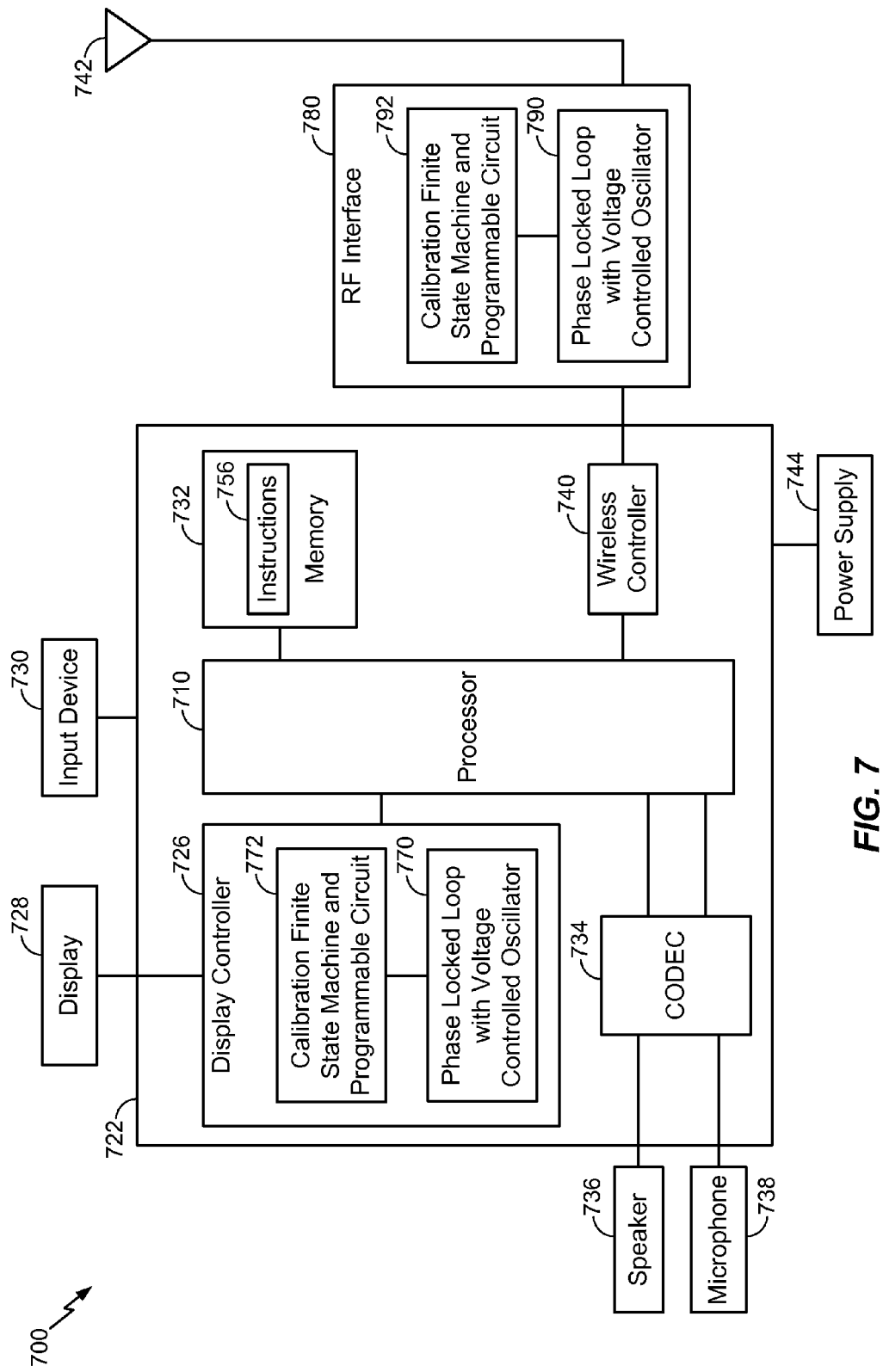
FIG. 7 is a block diagram of a wireless device including a component operable to adjust a duty cycle and a phase of a clock signal.

Referring to FIG. 7, a block diagram of a wireless device 700 including components operable to adjust a duty cycle and a phase of clock signal is shown. The device 700 includes a processor 710, such as a digital signal processor (DSP), coupled to a memory 732.

FIG. 7 also shows a display controller 726 that is coupled to the processor 710 and to a display 728. The display controller 726 may include a phase-locked loop (PLL) with a voltage controlled oscillator (VCO) 770 coupled to a calibration FSM (FSM) and a programmable circuit 772. In an illustrative embodiment, the calibration FSM and programmable circuit 772 may include the programmable circuit 102 and the control circuit 108 of FIG. 1, the programmable buffer 202 and the control circuit 108 of FIG. 2, the programmable buffer 202 and the control circuit 108 of FIG. 3, or the clock phase generator 401 and the calibration FSM 408 of FIG. 4. The calibration FSM and the programmable circuit 772 may adjust a duty cycle and/or a phase of a clock signal that may be generated by the PLL 770, as described with reference to the output signal 212 of FIG. 2 and the delayed clock signal 411 of FIG. 4. In a particular embodiment, the calibration FSM and the programmable circuit 772 may perform the method 500 of FIG. 5 and/or the method 600 of FIG. 6 to generate a clock signal thr use in a high speed interface of the display 728, such as a serializer/deserializer (SERDES) interface or another high-speed interface that uses multiple data lanes.

A coder/decoder (CODEC) 734 can also be coupled to the processor 710. A speaker 736 and a microphone 738 can be coupled to the CODEC 734. FIG. 7 also indicates that a wireless controller 740 can be coupled to the processor 710 and to a wireless antenna 742.

In a particular embodiment, a radio frequency (RE) interface 780 disposed between the wireless controller 740 and the wireless antenna 742 includes a phase-locked loop (PLL) with a voltage controlled oscillator (VCO) 790 coupled to a calibration finite state machine (FSM) and a programmable circuit 792. In an illustrative embodiment, the calibration FSM and programmable circuit 792 may include the programmable circuit 102 and the control circuit 108 of FIG. 1, the programmable buffer 202 and the control circuit 108 of FIG. 2, the programmable buffer 202 and the control circuit 108 of FIG. 3, or the clock phase generator 401 and the calibration FSM 408 of FIG. 4. The calibration FSM and the programmable circuit 792 may adjust a duty cycle and/or a phase of a clock signal that may be generated by the PLL 770, as described with reference to the output signal 212 of FIG. 2 and the delayed clock signal 411 of FIG. 4. In a particular embodiment, the calibration FSM and the programmable circuit 792 may perform the method 500 of FIG. 5 and/or the method 600 of FIG. 6.

The memory 732 may be a tangible non-transitory processor-readable storage medium that includes executable instructions 756. The instructions 756 may be executed by a processor, such as the processor 710 or a processor within the calibration finite machines 772, 792 to modify at least one operating parameter of a programmable buffer that may be included in the programmable circuits 772, 792. When the at least one operating parameter of the programmable buffer is modified, the programmable buffer may adjust a duty cycle of an output signal based on the at least one operating parameter. The instructions 756 may also be executable to generate a control signal and provide the control signal to a programmable delay element that may be included in the programmable circuits 772, 792. When the control signal is provided to the programmable delay element, the programmable delay element may adjust a delay of a delayed clock signal based on the control signal.

In a particular embodiment, the processor 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

In conjunction with the described embodiments, an apparatus includes means for generating an output signal and for adjusting a duty cycle of the output signal. For example, the means for generating and adjusting the duty cycle of the output signal may include the programmable circuit 102 of FIG. 1, the programmable buffer 202 of FIG. 2, the programmable buffer 202 of FIG. 3, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to generate an output signal and for adjusting a duty cycle of the output signal, or any combination thereof.

The apparatus may also include means filtering the output signal to generate a filtered signal having a voltage level. The voltage level may indicate the duty cycle of the output signal. For example, the means for filtering the output signal may include the low pass filter 104 of FIG. 1, the low pass filter 204 of FIG. 2, the low pass filter 204 of FIG. 3, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to filter an output signal to generate a filtered signal having a voltage level, or any combination thereof.

The apparatus may further include means for comparing the voltage level to a reference voltage. For example, the means for comparing the voltage level to the reference voltage may include the comparator 106 of FIG. 1, the comparator 206 of FIG. 2, the comparator 206 of FIG. 3, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to compare the voltage level to a reference voltage, or any combination thereof.

The apparatus may also include means for modifying at least one operating parameter of the means for generating to adjust the duty cycle of the output signal. For example, the means for modifying the at least one operating parameter may include the control circuit 108 of FIG. 1, the calibration FSM 208 of FIG. 2, the calibration FSM 208 of FIG. 3, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to modify at least one operating parameter to adjust the duty cycle of the output signal, or any combination thereof.

In conjunction with the described embodiments, an apparatus includes means thr generating a delayed clock signal in response to receiving an input clock signal. For example, the means for generating the delayed clock signal may include the programmable circuit 102 of FIG. 1, the clock phase generator 401 including the programmable delay element 402 of FIG. 4, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to generate a delayed clock signal, or any combination thereof.

The apparatus may also include means for generating an overlap signal based on the input clock signal and the delayed clocks signal. For example, the means for generating the overlap signal may include the programmable circuit 102 of FIG. 1, the clock phase generator 401 including the AND digital logic gate 103 of FIG. 4, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to generate an overlap clock signal, or any combination thereof.

The apparatus may also include means for filtering the overlap signal to generate a filtered signal having a voltage level. For example, the means for filtering the overlap signal may include the low pass filter 104 of FIG. 1, the low pass filter 404 of FIG. 4, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to filter an overlap signal to generate a filtered signal having a voltage level, or any combination thereof.

The apparatus may also include means for comparing the voltage level to a reference voltage to generate a control signal. For example the means for comparing the voltage level to a reference voltage may include the comparator 106 of FIG. 1, the comparator 406 of FIG. 4, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to compare the voltage level to a reference voltage, or any combination thereof. The means for generating the control signal may include the control circuit 108 of FIG. 1, the calibration FSM 408 of FIG. 4, the programmable circuit and calibration FSM 772 of FIG. 7, the programmable circuit and calibration FSM 792 of FIG. 7, the processor 710 programmed to execute the instructions 756 of FIG. 7, one or more other devices, circuits, modules, or instructions to generate a control signal, or any combination thereof.

The apparatus may also include means for adjusting a delay of a programmable delay element responsive to the control signal. For example, the means for adjusting the delay of the programmable delay element may include the control circuit 108 of FIG. 1, the calibration FSM 408 of FIG. 4, the programmable circuit and calibration FSM 772 of FIG. 7, the programmable circuit and calibration FSM 792 of FIG. 7, the processor 710 programmable to execute the instructions 756 of FIG. 7, one or more other devices, circuits, modules, or instructions to adjust a delay of a programmable delay element, or any combination thereof.

Figure 8:
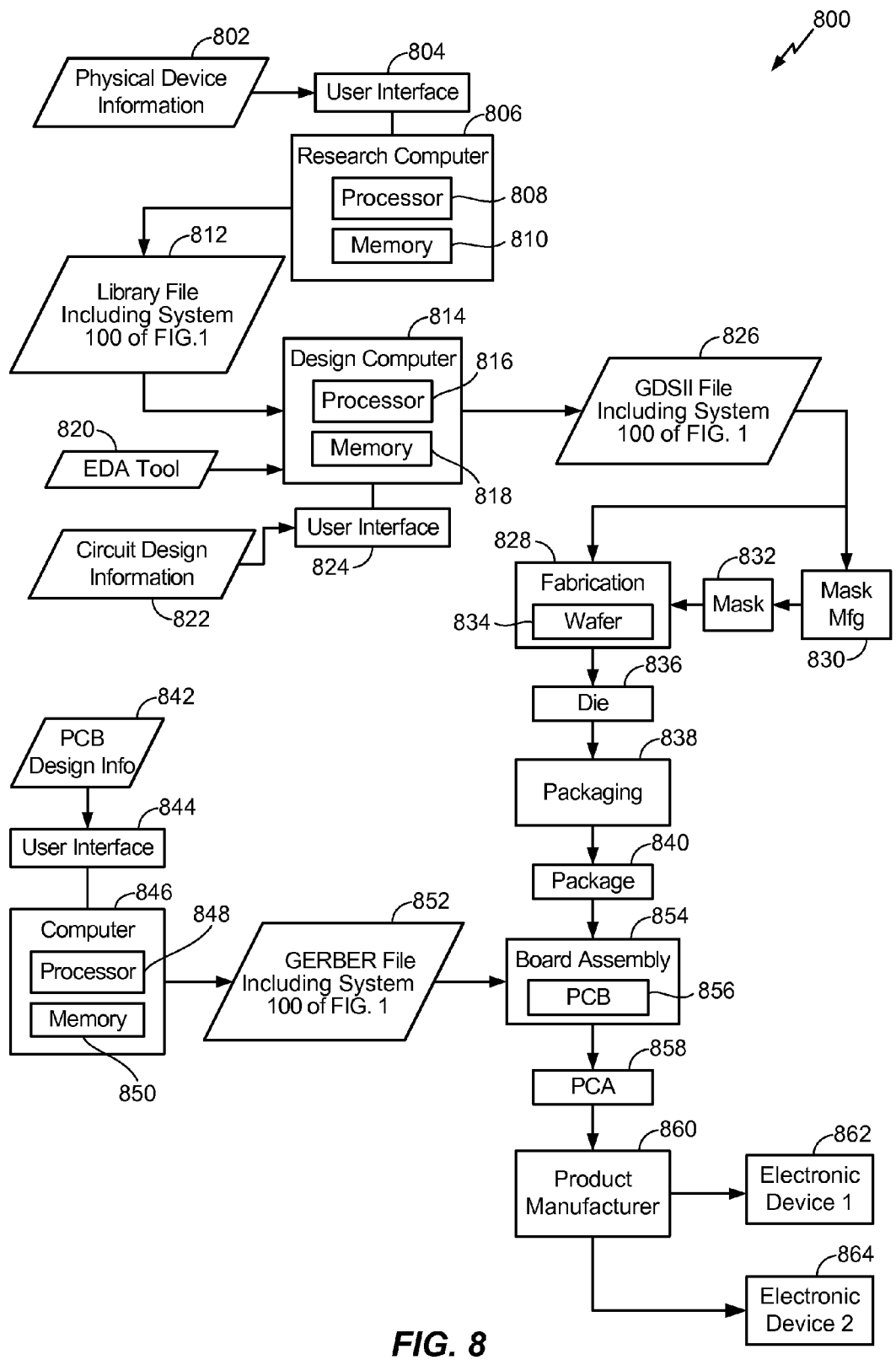
FIG. 8 is a data flow diagram of a particular illustrative embodiment of a manufacturing process to manufacture electronic devices that include a component operable to adjust a duty cycle and a phase of a clock signal.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as a device that includes the system 100 of FIG. 1, the circuit 200 of FIG. 2, the system 300 of FIG. 3, the circuit 400 of FIG. 4, or any combination thereof. For example, the semiconductor device may include the programmable circuit 102 of FIG. 1, the low pass filters 104-404 of FIGS. 1-4, the comparators 106-406 of FIGS. 1-4, the calibration FSMs 108-408 of FIGS. 1-4, the programmable buffers 202-302 of FIGS. 2 and 3, the pre-emphasis driver 350 of FIG. 3, the transmitter 352 of FIG. 3, the pass gate 348 of FIG. 3, the level shifters 340, 342, 346 of FIG. 3, the programmable delay element 402 of FIG. 4, the AND digital logic gate 403 of FIG. 4, the calibration finite state machines and programmable circuits 772, 792 of FIG. 7, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including the system 100 of FIG. 1, the circuit 200 of FIG. 2, the system 300 of FIG. 3, the circuit 400 of FIG. 4, or any combination thereof. For example, the semiconductor devices may include the programmable circuit 102 of FIG. 1, the low pass filters 104-404 of FIGS. 1-4, the comparators 106-406 of FIGS. 1-4, the calibration FSMs 108-408 of FIGS. 1-4, the programmable buffers 202-302 of FIGS. 2 and 3, the pre-emphasis driver 350 of FIG. 3, the transmitter 352 of FIG. 3, the pass gate 348 of FIG. 3, the level shifters 340, 342, 346 of FIG. 3, the programmable delay element 402 of FIG. 4, the AND digital logic gate 403 of FIG. 4, the calibration finite state machines and programmable circuits 772, 792 of FIG. 7, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a device that includes the system 100 of FIG. 1, the circuit 200 of FIG. 2, the system 300 of FIG. 3, the circuit 400 of FIG. 4, or any combination thereof, of the library file 812. For example, a user of the design computer 814 may enter circuit design information 822 via a user interface 824 coupled to the design computer 814. The circuit design information 822 may include design information representing at least one physical property of a semiconductor device that includes the system 100 of FIG. 1, the circuit 200 of FIG. 2, the system 300 of FIG. 3, the circuit 400 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing a device that includes the system 100 of FIG. 1, the circuit 200 of FIG. 2, the system 300 of FIG. 3, the circuit 400 of FIG. 4, or any combination thereof. To illustrate, the data file may include information corresponding to a system-on-chip (SOC) that includes the system 100 of FIG. 1, the circuit 200 of FIG. 2, the system 300 of FIG. 3, the circuit 400 of FIG. 4, or any combination thereof, and that also includes additional electronic circuits and components within the SOC.

The GDSII file 826 may be received at a fabrication process 828 to manufacture a semiconductor device that includes the system 100 of FIG. 1, the circuit 200 of FIG. 2, the system 300 of FIG. 3, the circuit 400 of FIG. 4, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including the system 100 of FIG. 1, the circuit 200 of FIG. 2, the system 300 of FIG. 3, the circuit 400 of FIG. 4, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the a device that includes the system 100 of FIG. 1, the circuit 200 of FIG. 2, the system 300 of FIG. 3, the circuit 400 of FIG. 4, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the system 100 of FIG. 1, the circuit 200 of FIG. 2, the system 300 of FIG. 3, the circuit 400 of FIG. 4, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (FDA), a fixed location data unit, and a computer, into which the system 100 of FIG. 1, the circuit 200 of FIG. 2, the system 300 of FIG. 3, the circuit 400 of FIG. 4, or any combination thereof is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof in addition to remote units according to teachings of the disclosure, embodiments of the disclosure may be suitably employed in any device which includes active integrated circuitry including memory and on-chip circuitry.

A device that includes the system 100 of FIG. 1, the circuit 200 of FIG. 2, the system 300 of FIG. 3, the circuit 400 of FIG. 4, or any combination thereof. For example, the device may include the programmable circuit 102 of FIG. 1, the low pass filters 104-404 of FIGS. 1-4, the comparators 106-406 of FIGS. 1-4, the calibration FSMs 108-408 of FIGS. 1-4, the programmable buffers 202-302 of FIGS. 2 and 3, the pre-emphasis driver 350 of FIG. 3, the transmitter 352 of FIG. 3, the pass gate 348 of FIG. 3, the level shifters 340, 342, 346 of FIG. 3, the programmable delay element 402 of FIG. 4, the AND digital logic gate 403 of FIG. 4, the calibration finite state machines and programmable circuits 772, 792 of FIG. 7, or any combination thereof, may be fabricated, processed, and incorporated into an electronic device, as described in the illustrative process 800. One or more aspects of the embodiments disclosed with respect to FIGS. 1-7 may be included at various processing states, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
  receiving an input clock signal at a programmable buffer;
  filtering an output signal from the programmable buffer to generate a filtered signal having a voltage level, the voltage level indicating a duty cycle of the output signal;
  comparing the voltage level of the filtered signal to a reference voltage to generate a comparison signal;
  in response to a value of a clocked enable signal at a calibration finite state machine, generating a first digital code at the calibration finite state machine based on the comparison signal and based on at least one other digital code provided to the programmable buffer; and
  selectively activating a first set of digital logic of the programmable buffer based on a logic level of the input clock signal and based on the first digital code from the calibration finite state machine to change a charging rate of a node to adjust the duty cycle of the output signal of the programmable buffer.

2. The method of claim 1, further comprising:
  in response to the value of the clocked enable signal, generating a second digital code at the calibration finite state machine based on the comparison signal and based on the at least one other digital code provided to the programmable buffer; and
  selectively activating a second set of digital logic of the programmable buffer based on the logic level of the input clock signal and based on the second digital code from the calibration finite state machine to change a discharging rate of the node to adjust the duty cycle of the output signal of the programmable buffer.

3. The method of claim 2, further comprising sending the first digital code and the second digital code from a calibration finite state machine to one or more additional programmable buffers, wherein each of the one or more additional programmable buffers generates an output clock signal.

4. The method of claim 1, wherein selectively activating the first set of digital logic includes selectively activating at least one p-type metal oxide semiconductor (PMOS) transistor of a plurality of PMOS transistors that are connected in parallel between the node and a power supply, wherein a logic level of the output signal is generated at the node based on the charging of the node, and wherein selectively activating the at least one PMOS transistor is based on the first digital code.

5. The method of claim 1, wherein selectively activating the second set of digital logic includes selectively activating at least one n-type metal oxide semiconductor (NMOS) transistor of a plurality of NMOS transistors that are connected in parallel between the node and a ground node, and wherein the at least one NMOS transistor is selectively activated by a negated OR (NOR) digital logic gate connected to the NMOS transistor.

6. The method of claim 1, wherein the output signal is an output clock signal.

7. The method of claim 1, wherein the output signal has a duty cycle of fifty percent.

8. The method of claim 7, wherein a duty cycle of the input clock signal is not fifty percent.

9. The method of claim 1, wherein the reference voltage corresponds to a direct-current (DC) voltage level indicative of a fifty percent duty cycle.

10. The method of claim 9, wherein the voltage level of the filtered signal corresponds to a DC voltage level of the output signal.

11. An apparatus comprising:
  a comparator configured to generate a comparison signal based on a voltage level of a filtered signal and a reference voltage;
  a calibration finite state machine configured to generate a first digital code, in response to a value of a clocked enable signal, based on the comparison signal and based on at least one other digital code of the calibration finite state machine; and
  a programmable buffer configured to generate an output signal based on a received input clock signal, wherein the programmable buffer is configured to selectively activate a first set of digital logic of the programmable buffer based on a logic level of the input clock signal and based on the first digital code from the calibration finite state machine to change a charging rate of a node to adjust a duty cycle of the output signal of the programmable buffer.

12. The apparatus of claim 11, wherein the calibration finite state machine generates a second digital code based on the comparison signal and based on the at least one other digital code, and wherein the programmable buffer is configured to selectively activate a second set of digital logic of the programmable buffer based on the logic level of the input clock and based on the second digital code from the calibration finite state machine to change a discharge rate of the node to adjust the duty cycle of the output signal of the programmable buffer.

13. The apparatus of claim 12, further comprising:
  a first multiplexer configured to provide the first digital code to the programmable buffer; and
  a second multiplexer configured to provide the second digital code to the programmable buffer.

14. The apparatus of claim 11, further comprising a low pass filter circuit configured to generate the filtered signal by filtering the output signal, wherein the filtered signal has a voltage level that indicates the duty cycle of the output signal.

15. The apparatus of claim 11, integrated into at least one semiconductor die.

16. The apparatus of claim 11, further comprising a device selected from the group consisting of a set top box, a music player, a video player, an entertainment unit, a navigation device, a communications device, a personal digital assistant (PDA), a fixed location data unit, and a computer, into which the programmable buffer is integrated.

17. An apparatus comprising:
   means for filtering the output signal of a programmable buffer to generate a filtered signal having a voltage level, the voltage level indicating a duty cycle of an output signal;
   means for comparing the voltage level of the filtered signal to a reference voltage to generate a comparison signal;
   means for generating a first digital code in response to a value of a clocked enable signal, wherein the first digital code is generated based on the comparison signal and at least one other digital code provided to the programmable buffer; and
   means for selectively activating a first set of digital logic of the programmable buffer based on a logic level of an input clock signal and based on the first digital code to change a charging rate of a node.

18. The apparatus of claim 17, further comprising:
   means for generating a second digital code in response to the value of the clocked enable signal, wherein the second digital code is generated based on the comparison signal and the at least one other digital code provided to the programmable buffer; and
   means for selectively activating a second set of digital logic of the programmable buffer based on the logic level of the input clock and the second digital code to change the charging rate of the node.

19. The apparatus of claim 18, wherein the means for selectively activating the first set of digital logic includes means for sending the first digital code to one or more programmable buffers, and wherein the means for selectively activating the second set of digital logic includes means for sending the second digital code to the one or more programmable buffers, wherein each of the one or more programmable buffers generates an output clock signal.

20. The apparatus of claim 18, wherein the means for selectively activating the first set of digital logic comprises means for selectively activating at least one p-type metal oxide semiconductor (PMOS) transistor of a plurality of PMOS transistors that are connected in parallel between the node and a power supply, selectively activating at least one n-type metal oxide semiconductor (NMOS) transistor of a plurality of NMOS transistors that are connected in parallel between the node and ground, or any combination thereof, based on the first digital code or the second digital code, and wherein each of the plurality of PMOS transistors coupled to the node and each of the plurality of NMOS transistors coupled to the node is independently controlled by the first digital code or the second digital code.

21. A non-transitory computer-readable medium comprising instructions that, when executed by a processor, cause the processor to:
   in response to a value of a clocked enable signal at a calibration finite state machine, generate a first digital code at the calibration finite state machine based on a comparison signal and based on at least one other digital code provided to a programmable buffer; and
   output the first digital code to a programmable buffer, wherein the programmable buffer is configured to selectively activate a first set of digital logic based on a logic level of an input clock signal and the first digital code to change a charging rate of a node to adjust a duty cycle of an output signal of the programmable buffer.

22. The non-transitory computer-readable medium of claim 21, wherein the instructions, when executed by the processor, further cause the processor to generate a second digital code, in response to the clocked enable signal, at the calibration finite state machine based on the comparison signal and the at least one other digital code, wherein the programmable buffer is configured to selectively activate a second set of digital logic of the programmable buffer based on the logic level of the input clock and the second digital code from the calibration finite state machine to change a discharge rate of the node.

23. The non-transitory computer-readable medium of claim 22, wherein the instructions, when executed by the processor, further cause the processor to send the first digital code and the second digital code to one or more additional programmable buffers, wherein each of the one or more additional programmable buffers generates an output clock signal.

24. A method comprising:
   a step for receiving an input clock signal at a programmable buffer, wherein the programmable buffer is configured to selectively charge a node of the programmable buffer based on a first digital code and to selectively discharge the node based on a second digital code;
   a step for filtering an output signal from the programmable buffer to generate a filtered signal having a voltage level, the voltage level indicating a duty cycle of the output signal;
   a step for comparing the voltage level of the filtered signal to a reference voltage to generate a comparison signal;
   a step for generating a first digital code, in response to a value of a clocked enable signal, based on the comparison signal and at least one other digital code provided to the programmable buffer; and
   a step for generating a first digital code and a second digital code, in response to the clocked enable signal, based on the comparison signal and the at least one other digital code provided to the programmable buffer;
   a step for adjusting a duty cycle of the output signal of the programmable buffer by selectively activating a first set of digital logic of the programmable buffer based on a logic level of the input clock signal and the first digital code to change a charging rate of the node; and
   a step for adjusting the duty cycle of the output signal of the programmable buffer by selectively activating a second set of digital logic of the programmable buffer based on the logic level of the input clock signal and the second digital code to change a discharging rate of the node.

25. The method of claim 24, further comprising a step for sending the first digital code and the second digital code to one or more additional programmable buffers, wherein each of the one or more additional programmable buffers generates an output clock signal.

* * * * *